United States Patent
Wong

(10) Patent No.: US 9,018,753 B2
(45) Date of Patent: Apr. 28, 2015

(54) ELECTRONIC MODULES

(71) Applicant: STMicroelectronics Pte Ltd., Singapore (SG)

(72) Inventor: Wing Shenq Wong, Singapore (SG)

(73) Assignee: STMicroelectronics Pte Ltd, Singapore (SG)

(*) Notice: Subject to any disclaimer, the term of this patent is extended or adjusted under 35 U.S.C. 154(b) by 0 days.

(21) Appl. No.: 13/958,146

(22) Filed: Aug. 2, 2013

(65) Prior Publication Data

US 2015/0035133 A1 Feb. 5, 2015

(51) Int. Cl.
| | |
|---|---|
| H01L 23/12 | (2006.01) |
| H01L 23/22 | (2006.01) |
| H01L 23/24 | (2006.01) |
| H01L 23/04 | (2006.01) |
| H01L 21/82 | (2006.01) |
| H01L 23/00 | (2006.01) |
| H01L 21/10 | (2006.01) |

(52) U.S. Cl.
CPC ............... *H01L 23/04* (2013.01); *H01L 21/82* (2013.01); *H01L 24/96* (2013.01); *H01L 21/10* (2013.01)

(58) Field of Classification Search
CPC ....................................................... H01L 23/10
USPC ............... 257/687, 704, E23.116, E23.135, 257/E23.193
See application file for complete search history.

(56) References Cited

U.S. PATENT DOCUMENTS

| | | | | |
|---|---|---|---|---|
| 5,256,901 | A * | 10/1993 | Ohashi et al. ............... | 257/680 |
| 5,841,128 | A * | 11/1998 | Shibuya et al. ............. | 250/208.1 |
| 5,889,323 | A * | 3/1999 | Tachibana .................... | 257/704 |
| 5,998,862 | A * | 12/1999 | Yamanaka .................... | 257/704 |
| 6,191,359 | B1 * | 2/2001 | Sengupta et al. ............ | 174/564 |
| 6,509,636 | B1 * | 1/2003 | Tsai et al. .................... | 257/678 |
| 6,515,360 | B2 * | 2/2003 | Matsushima et al. ........ | 257/704 |
| 6,627,966 | B2 * | 9/2003 | Jeong et al. .................. | 257/416 |
| 6,635,953 | B2 * | 10/2003 | Wu ............................... | 257/659 |
| 6,747,346 | B2 * | 6/2004 | Saito et al. ................... | 257/684 |
| 7,023,288 | B2 * | 4/2006 | Takanashi et al. .......... | 331/108 D |
| 7,405,456 | B2 * | 7/2008 | Chen et al. ................... | 257/434 |
| 7,410,836 | B2 * | 8/2008 | Huang .......................... | 438/124 |
| 7,521,790 | B2 * | 4/2009 | Tanida et al. ................ | 257/704 |
| 7,706,146 | B2 * | 4/2010 | Lee et al. ..................... | 361/752 |
| 8,581,357 | B2 * | 11/2013 | Vogt et al. .................... | 257/433 |
| 8,829,632 | B2 * | 9/2014 | Fuse et al. .................... | 257/432 |
| 2003/0197285 | A1 * | 10/2003 | Strandberg et al. .......... | 257/778 |
| 2005/0151272 | A1 * | 7/2005 | Street et al. .................. | 257/787 |
| 2005/0255627 | A1 * | 11/2005 | Omori ........................... | 438/64 |
| 2007/0018309 | A1 * | 1/2007 | Chang et al. ................. | 257/704 |
| 2014/0367718 | A1 * | 12/2014 | Park et al. .................... | 257/98 |

\* cited by examiner

FOREIGN PATENT DOCUMENTS

CN 101562191 A * 10/2009

*Primary Examiner* — Ida M Soward
(74) *Attorney, Agent, or Firm* — Gardere Wynne Sewell LLP

(57) ABSTRACT

A method is described for making electronic modules includes molding onto a substrate panel a matrix panel defining a plurality of cavities, attaching semiconductor die to the substrate panel in respective cavities of the molded matrix panel, electrically connecting the semiconductor die to the substrate panel, affixing a cover to the molded matrix panel to form an electronic module assembly, mounting the electronic module assembly on a carrier tape, and separating the electronic module assembly into individual electronic modules. An electronic module is described which includes a substrate, a wall member molded onto the substrate, the molded wall member defining a cavity, at least one semiconductor die attached to the substrate in the cavity and electrically connected to the substrate, and a cover affixed to the molded wall member over the cavity.

25 Claims, 8 Drawing Sheets

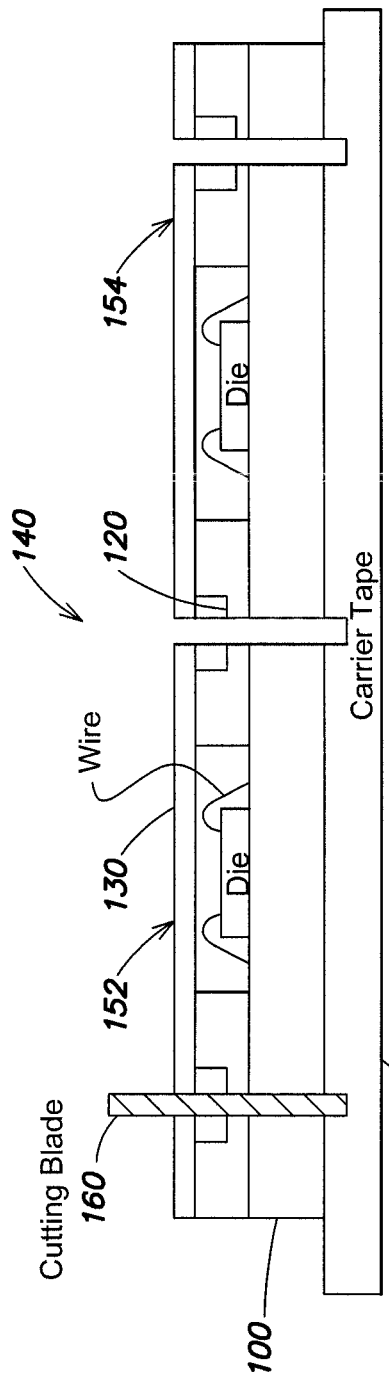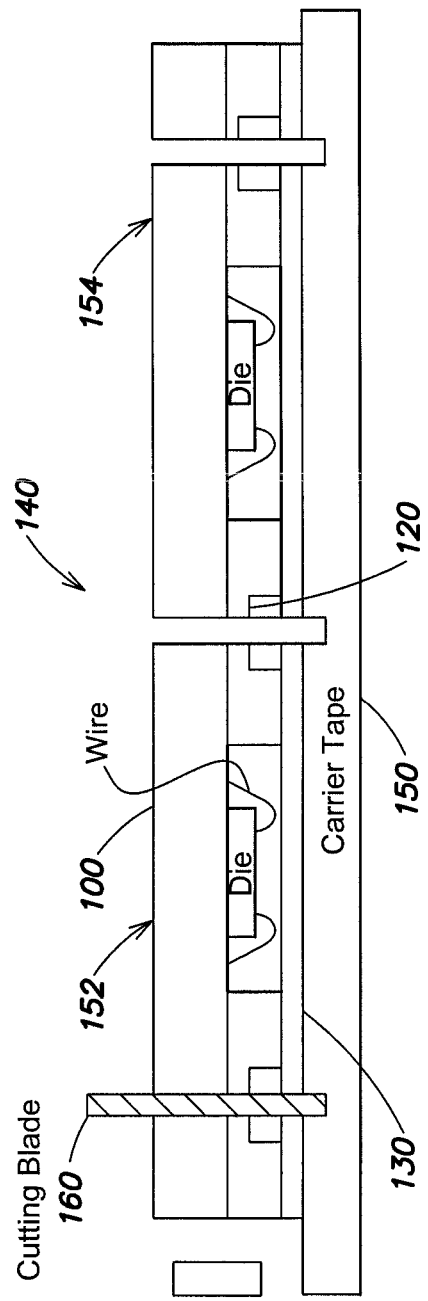

ELECTRONIC MODULES

FIELD OF THE INVENTION

This invention relates to electronic modules and to methods of making electronic modules. More particularly, the invention relates to optical modules such as camera modules and to methods of making, but is not limited to optical modules.

BACKGROUND OF THE INVENTION

Various electronic packaging techniques are utilized to achieve miniaturization, environmental protection and high performance. For example, an image sensor chip or die is mounted in a camera module having a light-transmissive window. The camera module is designed to provide good optical and electrical performance, and protection against the environment.

A package known as the optical land grid array (OLGA) package has been used for the packaging of electronic camera modules. The OLGA package includes a substrate having land grid array (LGA) pads on its rear surface. A semiconductor die, such as an image sensor, is mounted on a top surface of the substrate and is electrically connected to the substrate. The package further includes a structural element which encloses the semiconductor die and provides support for a glass cover. The structural element also serves as a support for a lens.

The semiconductor die is enclosed within a cavity of the OLGA package. However, the OLGA package includes an air vent to permit outgassing from adhesive used to make the package. Thus, contamination can potentially enter the cavity through the air vent. In addition, the adhesive used for attaching the glass cover to the structural element can potentially overflow into the cavity and can also cause misalignment of the glass cover. Furthermore, the process for making the OLGA package is relatively complex. Accordingly, there is a need for improved electronic modules and methods of making electronic modules which overcome one or more of the above drawbacks.

SUMMARY OF THE INVENTION

One or more of the above disadvantages are overcome by electronic modules and methods of making electronic modules in accordance with embodiments of the invention. A matrix panel including multiple cavities for enclosing electronic circuitry is molded onto a substrate panel. Semiconductor die are mounted in the cavities, the cavities are sealed, and the assembly is separated into individual electronic modules. The electronic modules may be optical modules, and more specifically, camera modules. However, the invention is not limited to camera modules or to optical modules.

According to a first aspect of the invention, a method is provided for making electronic modules, comprising molding onto a substrate panel a matrix panel defining a plurality of cavities, attaching semiconductor die to the substrate panel in respective cavities of the molded matrix panel, electrically connecting the semiconductor die to the substrate panel, affixing a cover to the molded matrix panel to form an electronic module assembly, mounting the electronic module assembly on a carrier tape, and separating the electronic module assembly into individual electronic modules, while the electronic module assembly is mounted on the carrier tape.

In some embodiments, the substrate panel has one or more electronic components attached thereto and the act of molding the matrix panel onto the substrate panel comprises encasing the one or more electronic components within the molded matrix panel.

In some embodiments, the molded matrix panel includes a glue drain groove around the periphery of each of the cavities. In some embodiments, each of the glue drain grooves is formed inside a periphery of a respective electronic module. In other embodiments, each of the glue drain grooves is formed at a periphery of a respective electronic module. In such embodiments, the act of separating the electronic module into individual electronic modules comprises sawing through the glue drain groove at the periphery of each of the electronic modules.

In some embodiments, the cover includes a light-transmissive glass, such as an infrared-transmissive glass. In other embodiments, the cover is at least partially opaque. In additional embodiments, the cover includes a lens mount. In some embodiments, the cover may include an opening to expose the semiconductor die to the external environment.

In some embodiments, each of the electronic modules includes one or more semiconductor die. In other embodiments, each of the electronic modules includes one or more cavities.

According to a second aspect of the invention, a method is provided for making camera modules, comprising molding onto a substrate panel a matrix panel defining a plurality of cavities, attaching semiconductor die to the substrate panel in respective cavities of the molded matrix panel, electrically connecting the semiconductor die to the substrate panel by wire bonding, dispensing an adhesive onto the molded matrix panel around the periphery of each of the cavities, affixing a light-transmissive cover to the molded matrix panel in contact with the adhesive, to form a camera module assembly, mounting the camera module assembly on a carrier tape, and separating the camera module assembly into individual camera modules, while the camera module assembly is mounted on the carrier tape.

According to a third aspect of the invention, an electronic module comprises a substrate, a wall member molded onto the substrate, the wall member defining a cavity, at least one semiconductor die attached to the substrate in the cavity and electrically connected to the substrate, and a cover affixed to the wall member over the cavity.

According to a fourth aspect of the invention, an electronic module comprises a structural element including a substrate and a wall member defining a cavity, wherein a top of the wall member includes a glue drain groove around a periphery of the cavity, at least one semiconductor die attached to the substrate in the cavity and electrically connected to the substrate, and a cover affixed to the wall member over the cavity.

BRIEF DESCRIPTION OF DRAWINGS

For a better understanding of the present invention, reference is made to the accompanying drawings, which are incorporated herein by reference and in which:

FIGS. 2-6 illustrate steps in a process for making electronic modules, in accordance with embodiments of the invention;

FIG. 7 is a cross-sectional view of an electronic module assembly, illustrating an alternate approach for separating the electronic module assembly into electronic modules;

DETAILED DESCRIPTION

Figure 1:
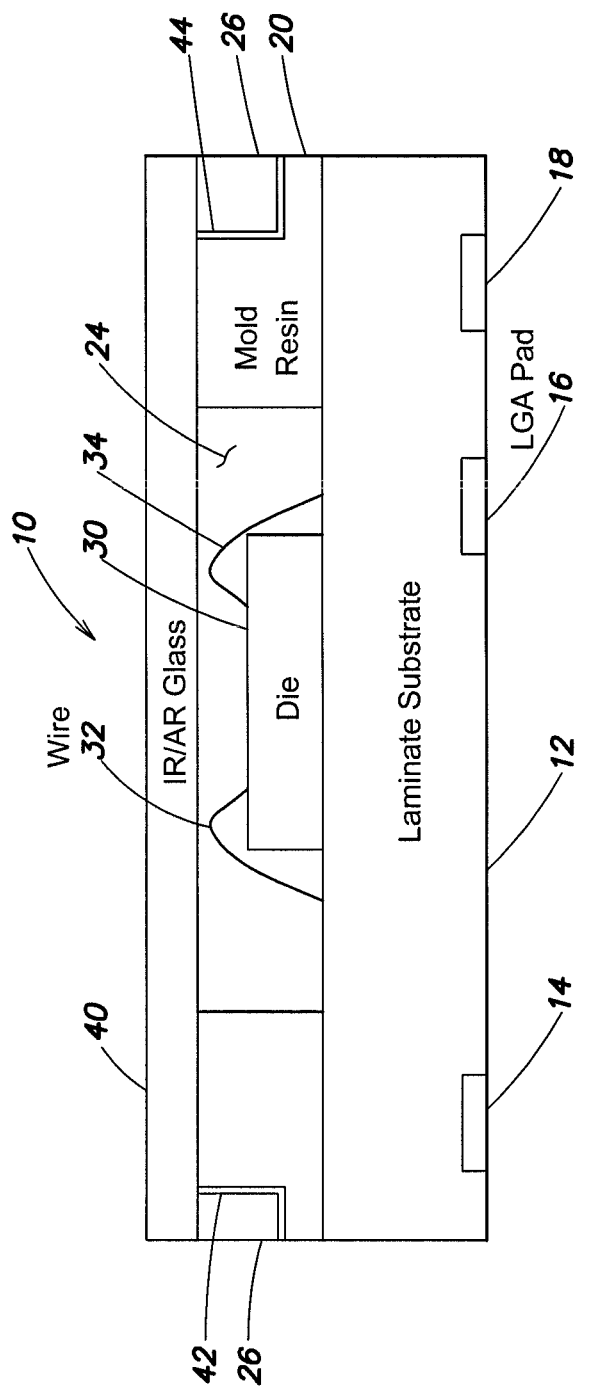
FIG. 1 is a simplified cross-sectional view of an electronic module in accordance with embodiments of the invention.

A simplified cross-sectional view of an electronic module 10 in accordance with embodiments of the invention is shown in FIG. 1. The electronic module 10 includes a substrate 12 having LGA pads 14, 16, 18 on its lower surface. In general, the substrate may include one or more LGA pads or other types of contacts on its lower surface. A molded wall member 20 is adhered to a top surface of substrate 12 and defines a cavity 24. In particular, molded wall member 20 surrounds cavity 24. As described below, molded wall member 20 is a section of a matrix panel which is molded onto the substrate 12. A semiconductor die 30 is affixed to the top surface of substrate 12 within cavity 24, and is electrically connected to substrate 12 by wires 32, 34. In general, the electronic module 10 may include one or more electrical connections between semiconductor die 30 and substrate 12. A cover 40 is attached to a top surface of molded wall member 20 by an adhesive 26 and seals cavity 24.

The molded wall member 20 may include glue drain grooves 42, 44 as described below. In the embodiment of FIG. 1, the glue drain grooves 42, 44 are located at the outer periphery of electronic module 10.

In some embodiments, electronic module 10 may be an optical module, such as a camera module. In such embodiments, semiconductor die 30 may be an image sensor die and cover 40 may be a light-transmissive member, such as an infrared transmissive glass.

In the embodiment of FIG. 1, the substrate 12 may be a laminate substrate including one or more metallization layers and conductive vias which provide electrical connections between pads on the top surface of substrate 12 and LGA pads 14, 16, 18. In some embodiments, the laminate substrate may be a BT (bismaleimide triazine) material.

By way of example only, the substrate 12 may have a thickness of 0.15-0.20 mm (millimeter), the molded wall member 20 may have a thickness of 0.5 to 1.50 mm, the cover 40 may have a thickness of 0.15-0.30 mm and the glue drain grooves 42, 44 may have a depth of less than 0.1 mm. The electronic module 10 may have dimensions in a plane perpendicular to FIG. 1, in different embodiments, of 6×6 mm, 10×10 mm or 12×12 mm. It will be understood that the above values are given by way of example only and are not limiting as to the scope of the present invention.

Methods of making electronic modules in accordance with embodiments of the invention are described with reference to FIGS. 2-8. The methods described herein may be used to make electronic modules of the type shown in FIGS. 1 and 9-14, as well as other types of electronic modules.

Figure 2:
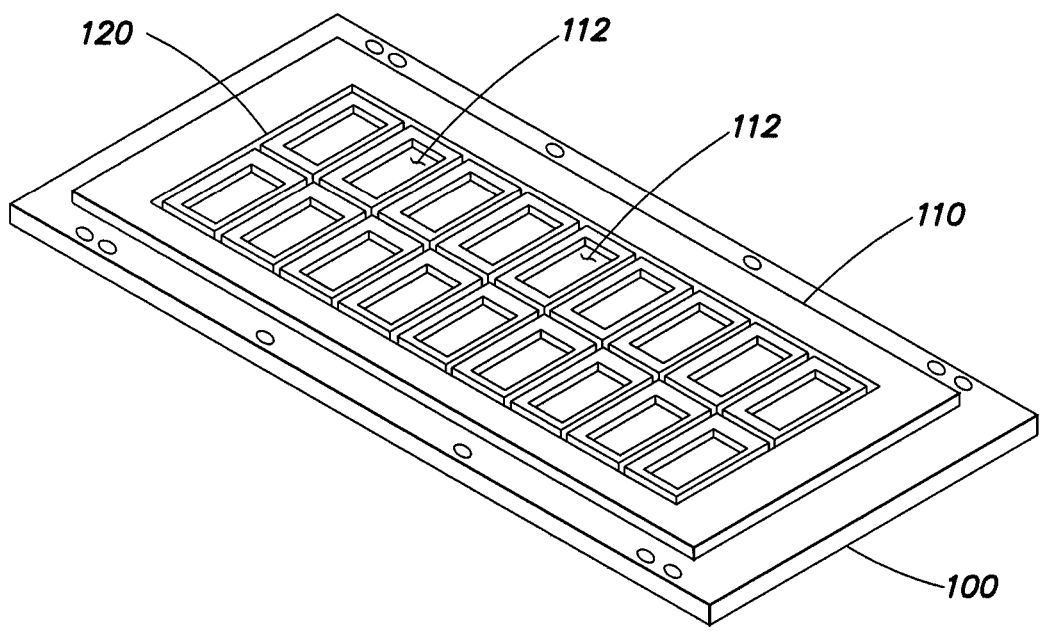

The methods of FIGS. 2-8 employ a substrate panel 100 and a matrix panel 110. The matrix panel 110 is molded directly onto substrate panel 100. The matrix panel 110 defines a plurality of cavities 112 in which the upper surface of substrate panel 100 is exposed. In the embodiment of FIG. 2, matrix panel 110 includes two rows of cavities 112, with nine cavities 112 in each row. However, it will be understood that the invention is not so limited and that the matrix panel may have any desired number and arrangement of cavities. The cavities 112 may be arranged in rows and columns, but are not limited to this arrangement. A top surface of matrix panel 110 is preferably flat and coplanar (except for glue drain grooves 120) to permit sealing of cavities 112 when the cover is attached to the top surface of matrix panel 110. The top surface of the matrix panel 110 may be provided with glue drain grooves 120 around the periphery of each cavity, as described below.

Referring to FIG. 2, matrix panel 110 is molded onto substrate panel 100 using conventional molding techniques. Matrix panel 110 may be a molded epoxy resin, for example. In one non-limiting example, the matrix panel 110 is a thermoplastic polyimide resin. In some embodiments, a transfer molding technique or a top gate molding technique may be utilized. In the molding process, the substrate panel 100 is preheated and the resin pellets are preheated. Then, the substrate panel is transferred to the mold cavity chase and the cavity chase is closed. The resin pellets are melted and the liquid resin is transferred through the mold cavity channel. The mold cavity chase is opened after the resin has cured to a solid state. The substrate panel 100 having matrix panel 110 molded thereon is then transferred to a degate station to remove the resin cull and runner. The next process step is post mold curing.

Figure 3:
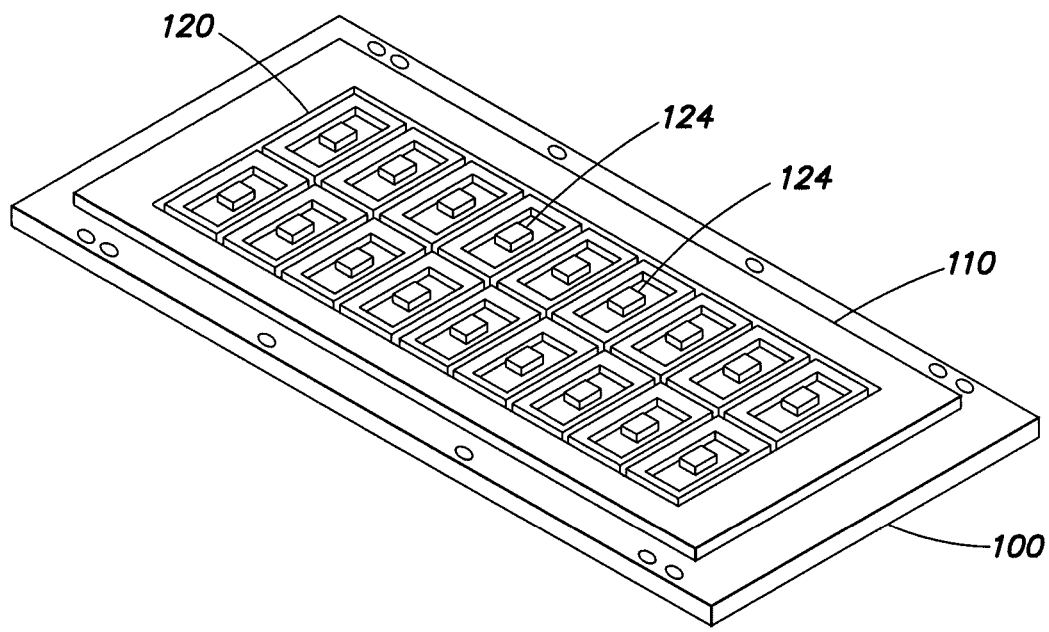

Referring to FIG. 3, an adhesive is dispensed onto the surface of substrate panel 100 in each of cavities 112. Then, a semiconductor die 124 is attached to the substrate panel 100 in each of the cavities 112, and the adhesive is allowed to cure. The adhesive can be a die attach epoxy glue, a polymer glue or a die attach film, for example. The adhesive can be a conductive or non-conductive type. Then, each of the semiconductor die 124 is electrically connected to pads on the substrate panel 100, typically by wire bonding.

Figure 4:
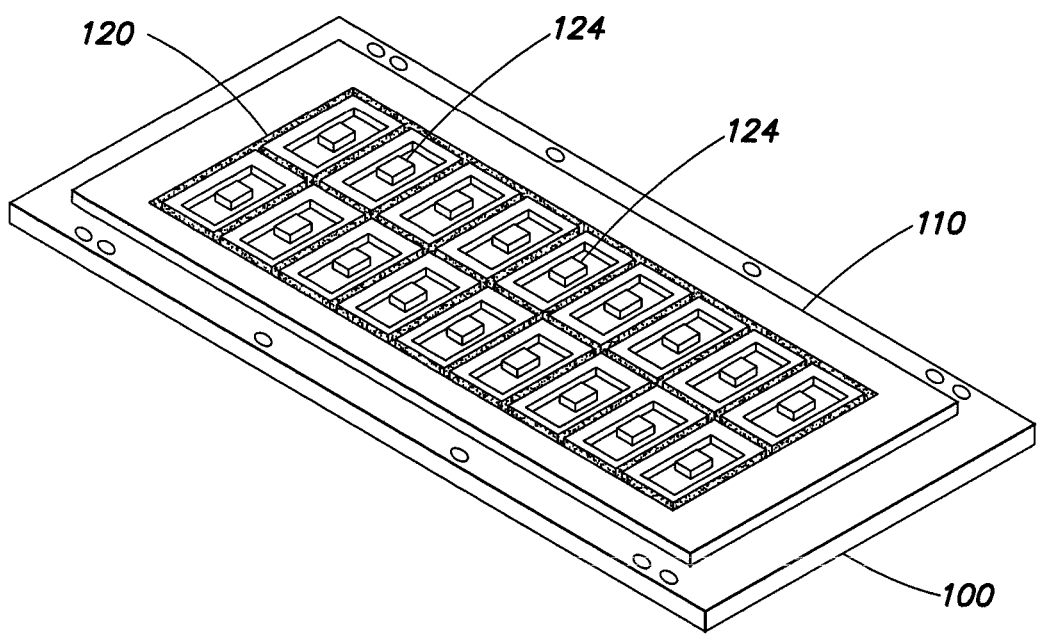

Referring to FIG. 4, an adhesive is dispensed onto upper surfaces of matrix panel 110 at least in areas surrounding cavities 112. In some embodiments, the adhesive is dispensed into the glue drain groove 120 that surrounds each of the cavities 112. The adhesive may be an ultraviolet (UV) glue, a thermal glue and/or an epoxy glue (acrylic).

Figure 5:
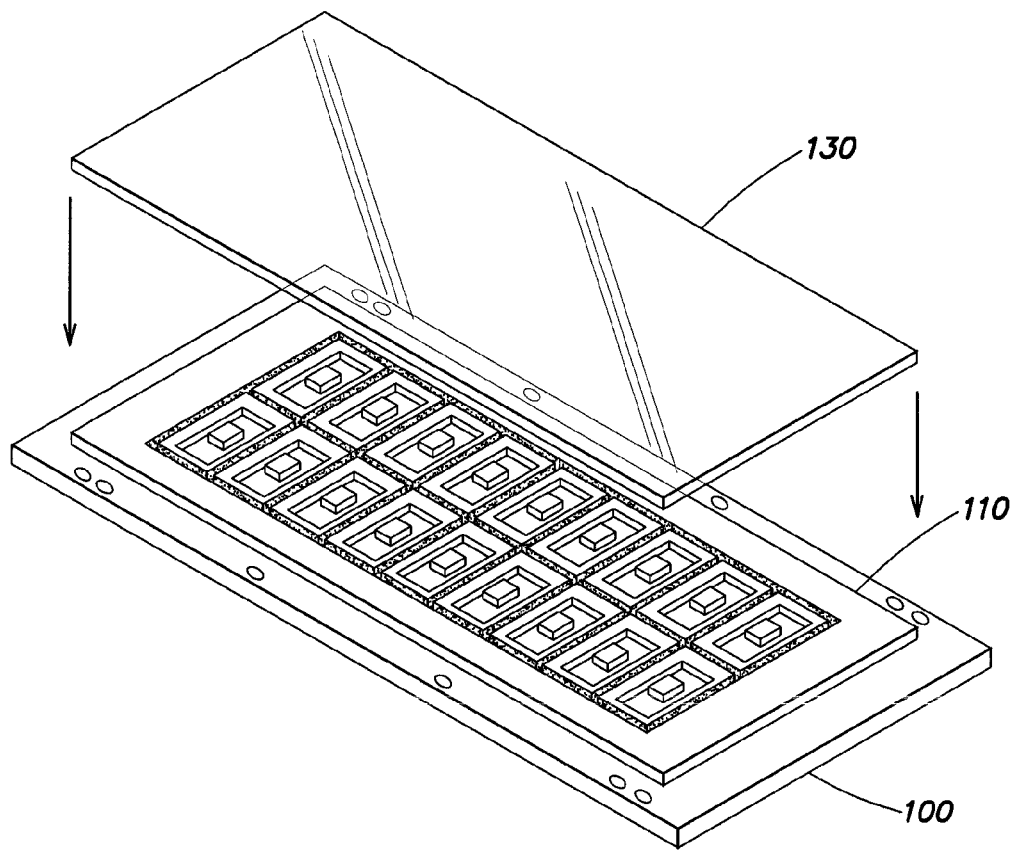
Figure 5A:
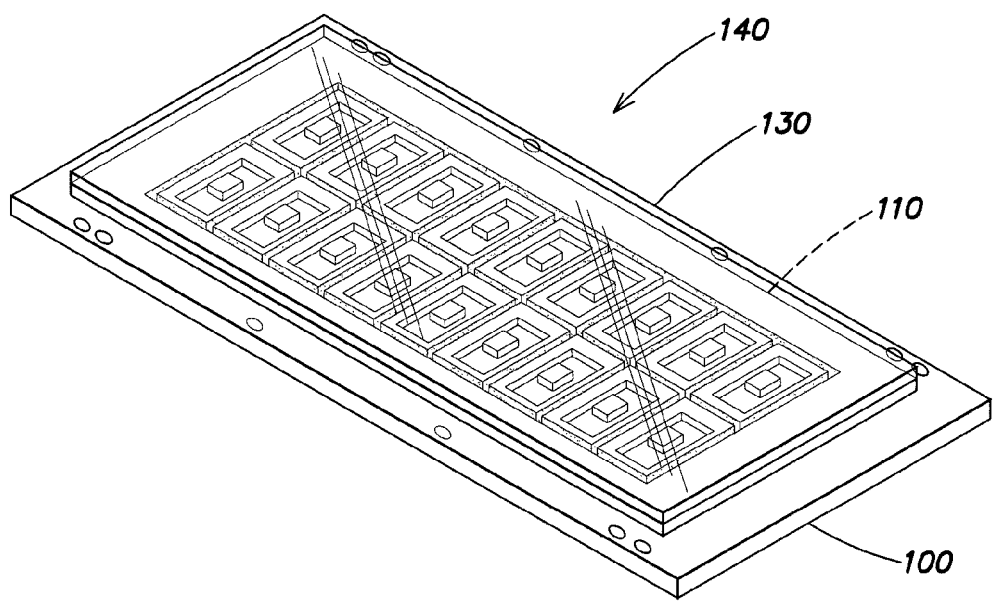
Figure 8:
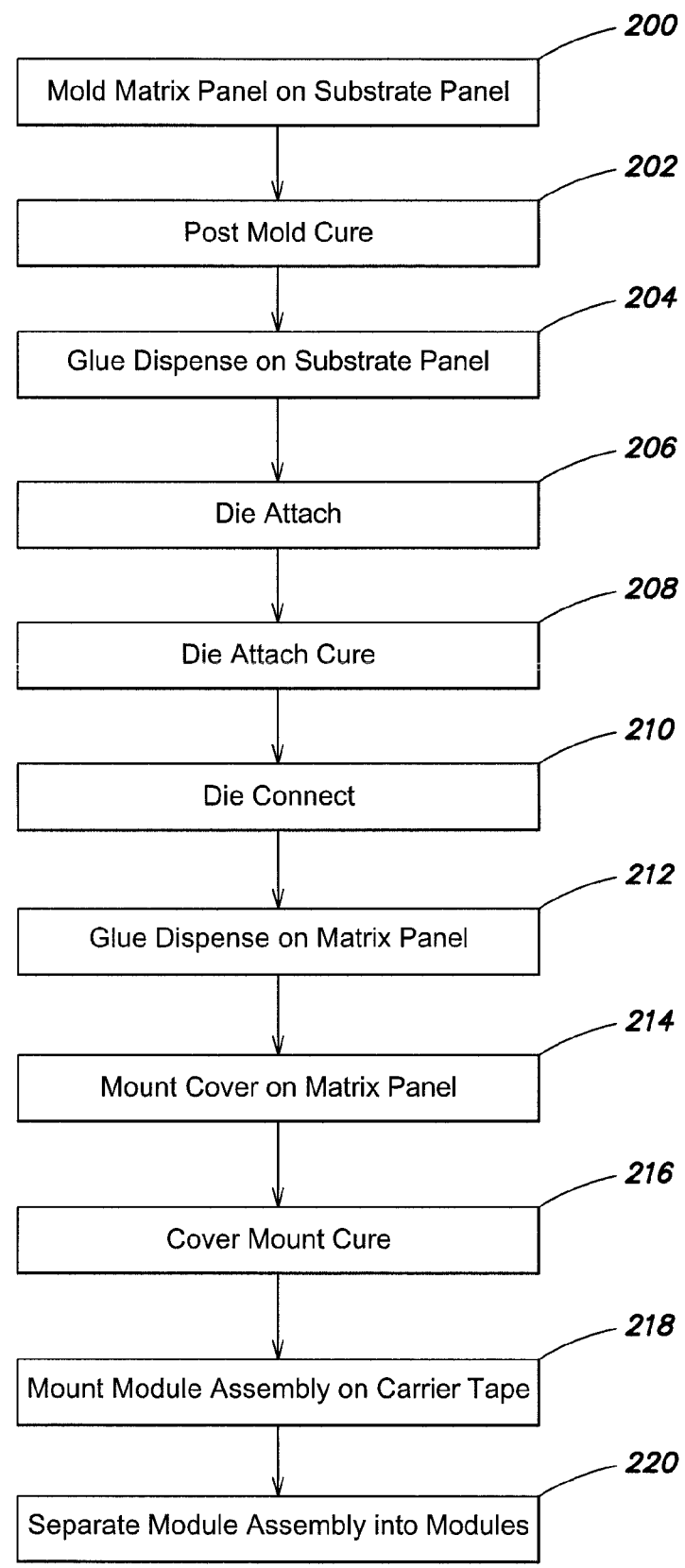
FIG. 8 is a flow chart of a method for making electronic modules, in accordance with embodiments of the invention.

Referring to FIGS. 5 and 5A, a cover 130 is positioned on the top surface of matrix panel 110 in contact with the adhesive. The cover 130 may be a light-transmissive glass, such as an infrared-transmissive glass. However, as described below, the cover 130 may have other configurations, such as an opaque cover, or the cover may serve as a lens holder. Further, the cover 130 may be of a material other than glass. The cover 130 may include an opening to provide environmental access to the semiconductor die. The adhesive is allowed to cure, so that the cavities 112 are sealed.

The substrate panel 100, the matrix panel 110 with semiconductor die 124 in respective cavities 112, and the cover 130 may be considered an electronic module assembly 140. The electronic module assembly 140 includes multiple electronic modules of the type shown by way of example in FIG. 1. As discussed below, each electronic module may include one or more cavities, and each cavity may include one or more semiconductor die. Further, the cover 130 may have different configurations according to the application of the electronic module.

Referring to FIG. 6, the electronic module assembly 140 is mounted to a carrier tape 150. The electronic module assembly 140 is then separated into individual electronic modules, such as electronic modules 152, 154. The electronic modules may be separated from each other by sawing with a cutting blade 160, using conventional circuit sawing techniques. In the embodiment of FIG. 6, the substrate panel 100 is attached to carrier tape 150 so that the electronic modules 152, 154 face upwardly from carrier tape 150.

Referring to FIG. 7, an alternate technique for separating the electronic module assembly 140 into individual electronic modules is shown. In the embodiment of FIG. 7, the cover 130 of the electronic module assembly 140 is attached to carrier tape 150 so that the electronic modules 152, 154 face downwardly toward carrier tape 150. The sawing with cutting blade 160 is performed in the same manner as in FIG. 6. In other embodiments, laser cutting or breaking (for ceramic) may be utilized.

It can be seen that electronic modules 152, 154 shown in FIGS. 6 and 7 correspond to electronic module 10 shown in FIG. 1 and described above. After separation of electronic module assembly 140 into individual electronic modules, the substrate 12 (FIG. 1) is a section of substrate panel 100 and molded wall member 20 is a section of matrix panel 110.

In the embodiments of FIGS. 6 and 7, it may be noted that the glue drain grooves 120 are located at the edges of electronic modules 152 and 154. Further, the cutting blade 160 cuts through the glue drain grooves 120. The glue drain grooves 120 provide a space for accumulation and flow of excess adhesive. As a result, overflow of excess adhesive is reduced or eliminated and misalignment of cover 130 is alleviated. In addition, the distribution of adhesive over the surface of matrix panel 110 is more uniform.

The process for making electronic modules, as illustrated in FIGS. 2-7 and described above, is summarized in the flowchart of FIG. 8.

In act 200, the matrix panel 110 is molded on substrate panel 100, as shown in FIG. 2.

In act 202, the molded matrix panel 110 on substrate panel 100 is cured, according to the requirements of the matrix panel material.

In act 204, a die attach adhesive is dispensed onto the substrate panel 100 in the locations in cavities 112 where semiconductor die are to be attached.

In act 206, semiconductor die 124 are attached to the substrate panel 100 in cavities 112, as shown in FIG. 3.

In act 208, the die attach adhesive is allowed to cure, according to the requirements of the adhesive utilized.

In act 210, the semiconductor die 124 are electrically connected to the substrate panel 100, typically by wire bonding, as described in connection with FIG. 3.

In act 212, adhesive 26 (FIG. 1) is dispensed on a top surface of matrix panel 110, typically in glue drain grooves 120, as shown in FIG. 4.

In act 214, cover 130 is mounted on matrix panel 110 in contact with adhesive 26, as shown in FIGS. 5 and 5A.

In act 216, the cover adhesive is allowed to cure, according to the requirements of the adhesive material utilized.

In act 218, the electronic module assembly 140 is mounted on carrier tape 150, as shown in FIG. 6, or as shown in the alternative of FIG. 7.

In act 220, electronic module assembly 140 is separated into individual electronic modules 152, 154, typically by sawing with cutting blade 160, as shown in FIGS. 6 and 7.

Embodiments of electronic modules in accordance with embodiments of the invention are shown in FIGS. 9-14. Like elements in FIGS. 1 and 9-14 have the same reference numerals. It will be understood that the features of the electronic modules shown in FIGS. 1 and 9-14 and described herein can be used in different combinations.

Figure 9:
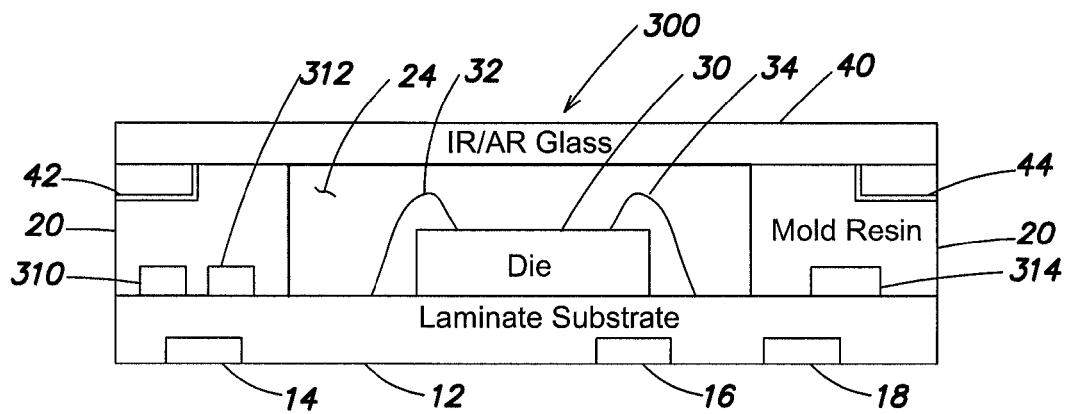
FIG. 9 is a simplified cross-sectional view of an electronic module having electronic components encased in the molded matrix panel, in accordance with embodiments of the invention.

A simplified cross-sectional view of an electronic module 300 in accordance with embodiments of the invention is shown in FIG. 9. The electronic module 300 includes one or more electronic components 310, 312 and 314, which are mounted on and electrically connected to substrate 12. The electronic components 310, 312, 314 may be passive components, such as resistors, capacitors, etc., and/or active components, such as transistors, diodes, etc. As shown in FIG. 9, electronic components 310, 312, 314 are encased within the molded wall member 20. The wall member 20 can be molded around electronic components 310, 312, 314. In the embodiment of FIG. 9, the size of cavity 24 can be reduced in comparison with configurations where the electronic components are located within cavity 24.

Figure 10:
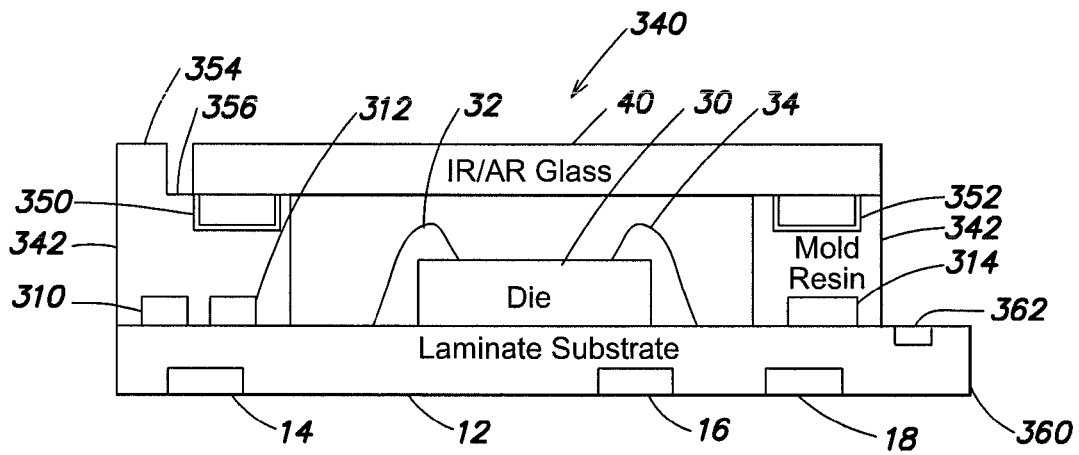
FIG. 10 is a simplified schematic diagram of an electronic module having a glue drain groove located inwardly of the periphery of the electronic module, in accordance with embodiments of the invention.

A simplified cross-sectional view of an electronic module 340 in accordance with embodiments of the invention is shown in FIG. 10. In the electronic module 340, a molded wall member 342 includes glue drain grooves 350, 352 which surround cavity 24, and which are located inwardly of the outer periphery of the electronic module. As a result, the molded wall member 342 can be provided at its outer periphery with a rim 354 which defines a recess 356 in which the cover 40 is mounted. By mounting the cover in recess 356, the outer edges of cover 40 are protected. The electronic module 340 of FIG. 10 further includes a substrate extension 360 which is an extension of substrate 12 that extends beyond wall member 342 and is provided with an electrical contact 362. This arrangement permits electrical contact to substrate 12 from above.

Figure 11:
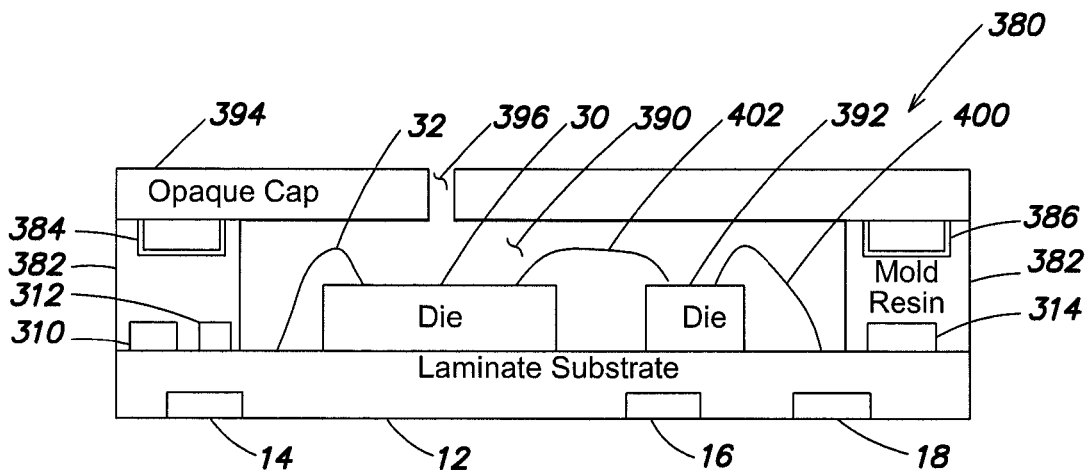
FIG. 11 is a simplified cross-sectional view of an electronic module which incorporates two semiconductor die and an opaque cover, in accordance with embodiments of the invention.

A simplified cross-section of an electronic module 380 in accordance with embodiments of the invention is shown in FIG. 11. The electronic module 380 of FIG. 11 includes a molded wall member 382 having glue drain grooves 384, 386 located around the periphery of a cavity 390 and inwardly of the outer periphery of electronic module 380. Semiconductor die 30 and an additional semiconductor die 392 are attached to substrate 12 within cavity 390. The semiconductor die 30 and 392 may be electrically connected to substrate 12 (wires 32 and 400) and may be electrically connected to each other (wire 402). Two or more semiconductor die may be attached to substrate 12 within cavity 390. The electronic module 380 of FIG. 11 is further provided with an opaque cover 394 having an opening 396. The opening 396 in cover 394 exposes the semiconductor die 30 and 392 to the external environment for devices such as an air pressure sensor, a gas detector, a microphone, and the like.

Figure 12:
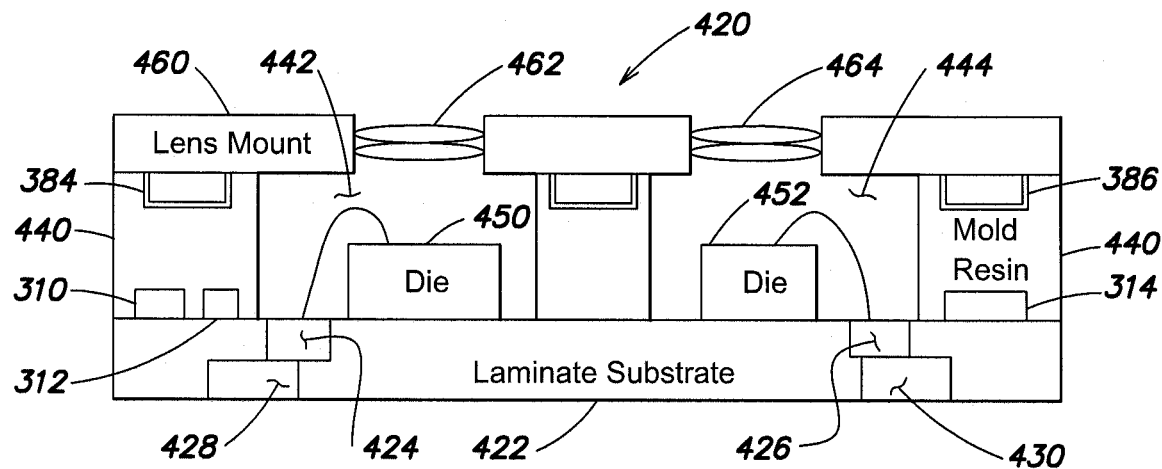
FIG. 12 is a simplified cross-sectional view of an electronic module having two cavities and a cover which includes lens mounts, in accordance with embodiments of the invention.

A simplified cross-sectional view of an electronic module 420 in accordance with embodiments of the invention is shown in FIG. 12. A substrate 422 includes vias 424, 426 connected to LGA pads 428, 430 respectively. A molded wall member 440 defines cavities 442 and 444. Semiconductor die 450, 452 are attached to substrate 422 within cavities 442, 444 respectively. A lens mount 460 is attached to a top surface of molded wall member 440. The lens mount 460 supports a lens 462 above semiconductor die 450 and a lens 464 above semiconductor die 452. The molded wall member may define two or more cavities. The semiconductor die 450 and 452 may be the same or different.

Figure 13:
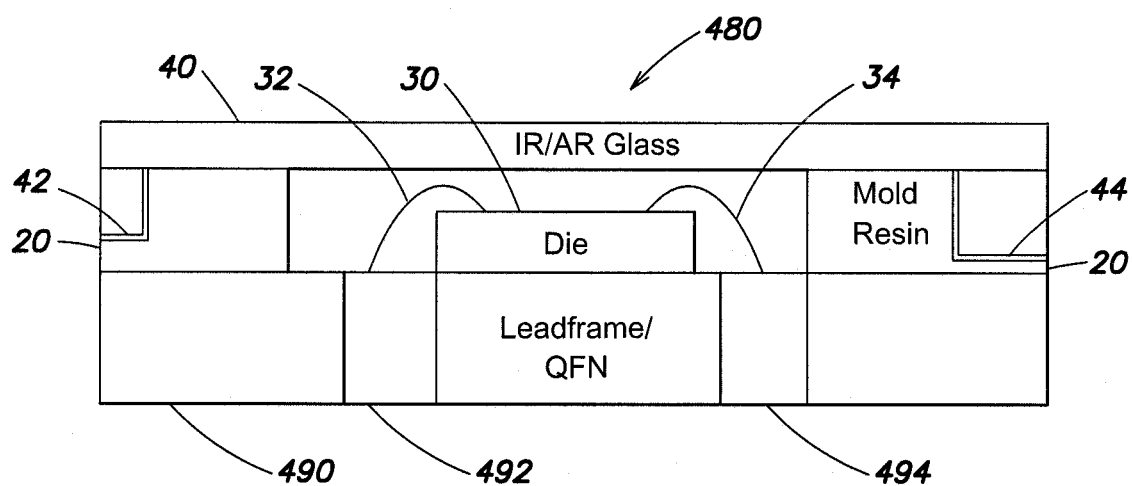
FIG. 13 is a simplified cross-sectional view of an electronic module which utilizes a leadframe for support of the semiconductor die and the molded wall member in accordance with embodiments of the invention.

A simplified cross-sectional view of an electronic module 480 in accordance with embodiments of the invention is shown in FIG. 13. In the embodiment of FIG. 13, the substrate is replaced with a leadframe 490 having conductive vias 492, 494. The leadframe 490 or a QFN (quad-flat, no-leads) leadframe may be, for example, a copper alloy.

Figure 14:
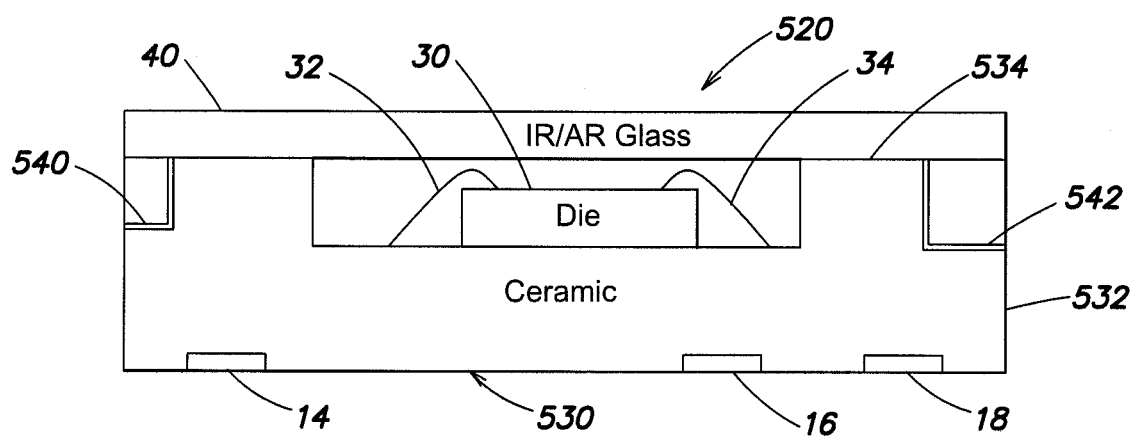
FIG. 14 is a simplified cross-sectional view of an electronic module which includes a ceramic member for support of the semiconductor die and the cover.

A simplified cross-sectional view of an electronic module 520 in accordance with embodiments of the invention is shown in FIG. 14. The substrate is replaced with a ceramic member 530. In the embodiment of FIG. 14, the ceramic member 530 serves as a structural element which includes a ceramic substrate 532 and a ceramic wall member 534 having glue drain grooves 540, 542 around the periphery of the electronic module 520. The ceramic wall member 534 supports cover 40.

Having thus described at least one illustrative embodiment of the invention, various alterations, modifications and improvements will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An electronic module comprising:
   a substrate;
   a wall member molded onto the substrate, the molded wall member defining a cavity, the molded wall member having a glue drain groove defining an outer periphery of the electronic module;
   at least one semiconductor die attached to the substrate in the cavity and electrically connected to the substrate; and
   a cover affixed to the molded wall member over the cavity.

2. An electronic module as defined in claim 1, wherein the cover comprises a light-transmissive glass.

3. An electronic module as defined in claim 1, wherein the cover includes a lens holder.

4. An electronic module as defined in claim 1, wherein the glue drain groove is formed in an outer peripheral edge of the molded wall member.

5. An electronic module as defined in claim 1, further comprising at least one electronic component attached to the substrate and encased in the molded wall member.

6. An electronic module as defined in claim 1, wherein a back surface of the substrate, opposite the molded wall member, includes one or more land grid array pads.

7. An electronic module as defined in claim 1, wherein the molded wall member defines two or more cavities, each having at least one semiconductor die attached to the substrate therein.

8. An electronic module as defined in claim 1, wherein two or more semiconductor die are attached to the substrate in the cavity.

9. An electronic module comprising:
   a structural element including a substrate and a wall member defining a cavity, wherein a top of the wall member includes a glue drain groove formed in an outer peripheral edge of the wall member;
   at least one semiconductor die attached to the substrate in the cavity and electrically connected to the substrate; and
   a cover affixed to the wall member over the cavity.

10. An electronic module as defined in claim 9, wherein the structural element includes a ceramic material.

11. An electronic module as defined in claim 9, wherein the substrate comprises a laminate substrate and the wall member comprises a molded wall member.

12. An electronic module, comprising:
   a substrate panel including a matrix panel defining a plurality of cavities;
   a semiconductor die attached to the substrate panel in each cavity of the matrix panel;
   wherein each semiconductor die is electrically connected to the substrate panel; and
   a cover affixed to the molded matrix panel.

13. The electronic module as defined in claim 12, wherein the matrix panel is a made of resin.

14. The electronic module as defined in claim 12, wherein the substrate panel has one or more electronic components attached thereto, and wherein the one or more electronic components are encased within the matrix panel.

15. The electronic module as defined in claim 12, wherein the matrix panel includes a glue drain groove around an outer periphery of each of cavity.

16. The electronic module as defined in claim 15, wherein the glue drain groove is formed inside a periphery of the electronic module.

17. The electronic module as defined in claim 15, wherein the glue drain groove is formed at a periphery of the electronic module.

18. The electronic module as defined in claim 12, wherein the cover is affixed to the matrix panel by one of an ultraviolet glue, a thermal glue and/or an adhesive glue.

19. The electronic module as defined in claim 12, wherein the cover includes light-transmissive glass.

20. The electronic module as defined in claim 12, wherein the cover is at least partially opaque.

21. The electronic module as defined in claim 12, wherein the cover includes a lens mount.

22. The electronic module as defined in claim 12, wherein the cavity is sealed by the cover.

23. The electronic module as defined in claim 12, further comprising wire bonds configured to electronically connect the semiconductor die to the substrate panel.

24. The electronic module as defined in claim 12, wherein a back surface of the substrate panel, opposite the matrix panel, includes one or more land grid array pads.

25. The electronic module as defined in claim 15, wherein the matrix panel defines wall members delimiting each cavity and the glue drain groove is formed in an outer peripheral edge of each wall member upon separation into individual electronic modules.

* * * * *